United States Patent

Oomen

[15] 3,646,413

[45] Feb. 29, 1972

[54] PIEZOELECTRIC-DRIVEN VARIABLE CAPACITOR

[72] Inventor: Johannes A. F. Oomen, Cincinnati, Ohio

[73] Assignee: Avco Corporation, Cincinnati, Ohio

[22] Filed: Sept. 25, 1970

[21] Appl. No.: 75,532

[52] U.S. Cl. ..........................317/246, 310/8.6, 317/249 R, 317/250

[51] Int. Cl. ..........................H01g 7/06

[58] Field of Search ..............317/249 R, 250, 246; 310/8.6; 332/51; 324/120

[56] References Cited

UNITED STATES PATENTS

| | | | |
|---|---|---|---|
| 2,863,076 | 12/1958 | Koren | 310/8.6 |
| 3,020,455 | 2/1962 | Reifel | 317/250 |
| 3,166,696 | 1/1965 | Furman | 317/250 |
| 3,189,802 | 6/1965 | Zisman | 317/250 |
| 3,290,595 | 12/1966 | Novotny | 317/250 |

*Primary Examiner*—E. A. Goldberg
*Attorney*—Charles M. Hogan and Eugene C. Goodale

[57] ABSTRACT

A piezoelectric-driven variable capacitor for creating a voltage-controlled variable reactance useful at high frequencies and high-power levels is disclosed. A piezoelectric flexure element is used as one of the capacitor plates. Means are provided to compensate for uneven expansion of the piezoelectric flexure element.

5 Claims, 7 Drawing Figures

INVENTOR.
JOHANNES A.F. OOMEN
BY Charles M. Hogan
Eugene C Goodale
ATTORNEYS

INVENTOR.
JOHANNES A.F. OOMEN
BY Charles M. Hogan
Eugene C. Goodale
ATTORNEYS

PIEZOELECTRIC-DRIVEN VARIABLE CAPACITOR

BACKGROUND OF THE INVENTION

This invention relates to capacitors and more particularly to a capacitor characterized by the use of a piezoelectric material as driver for one or both of its electrodes.

A piezoelectric material will change shape under the influence of an electric field. Certain examples of piezoelectric materials have been developed that achieve an amplification of the mechanical distortion of the material under the influence of such electric field and are referred to as piezoelectric flexure elements. These elements are made from very thin slabs of the piezoelectric ceramic material which are provided with electrodes and fused together in layers of two or more.

These piezoelectric flexure elements are commercially available from Clevite Corporation and are commonly referred to by the name Bimorph or Multimorph, depending on the number of layers. A typical example of such a piezoelectric member or Bimorph comprises a silver electrode on top, a piezoelectric ceramic layer, an intermediate electrode, a second piezoelectric ceramic layer, and a silver electrode at the bottom. When a voltage is applied to the top and bottom electrode, the resulting electric field between the electrodes will cause the top ceramic slab or layer to contract, while it will make the bottom ceramic slab expand. Mechanically, this results in the bending of the fused ceramic slabs. The bending is not always linear or uniform due to the characteristics of the material, temperature, vibration and to the method of fusing the layers together.

Accordingly, an object of this invention is to provide a variable capacitor which uses a piezoelectric material as driver for one or both of its electrodes.

A further object of this invention is to provide a variable capacitor whose value is determined by the change in shape of a piezoelectric material.

Another object of this invention is to provide a piezoelectric-driven variable capacitor having means for compensating for creep of the piezoelectric flexure element.

SUMMARY OF THE INVENTION

This invention provides a piezoelectric-driven variable capacitor. The capacitor utilizes a piezoelectric flexure element as a driver for one or both of its electrodes. The piezoelectric flexure element forms one plate of the capacitor. The value of the capacitor is determined by the change in shape of the piezoelectric flexure element under the influence of an externally applied electric voltage. Means are provided to compensate for creep of the piezoelectric flexure element.

Other details, uses, and advantages of this invention will become apparent as the following description of the exemplary embodiments thereof presented in the accompanying drawings proceeds.

BRIEF DESCRIPTION OF THE DRAWINGS

The accompanying drawings show present exemplary embodiments of this invention in which.

DESCRIPTION OF THE ILLUSTRATED EMBODIMENTS

Figure 1:
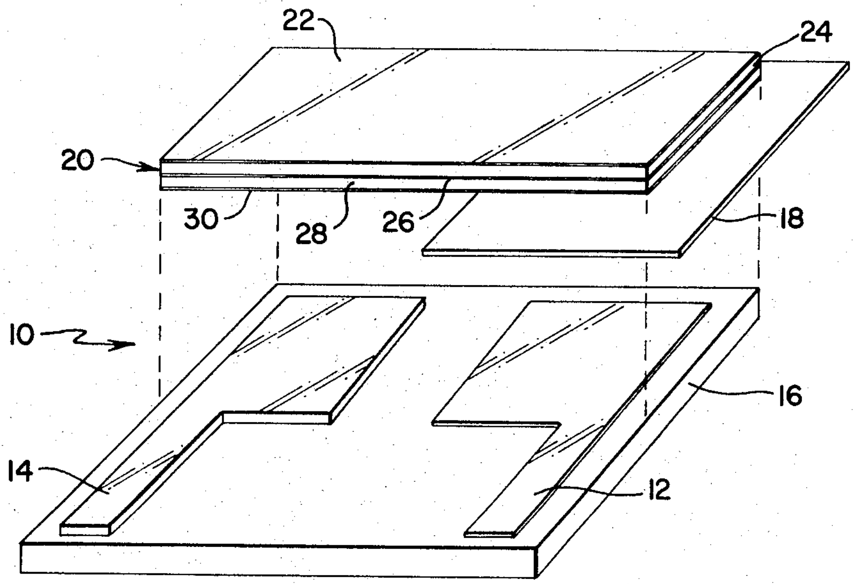
FIG. 1 is an exploded perspective view illustrating one exemplary embodiment of this invention.
Figure 2:
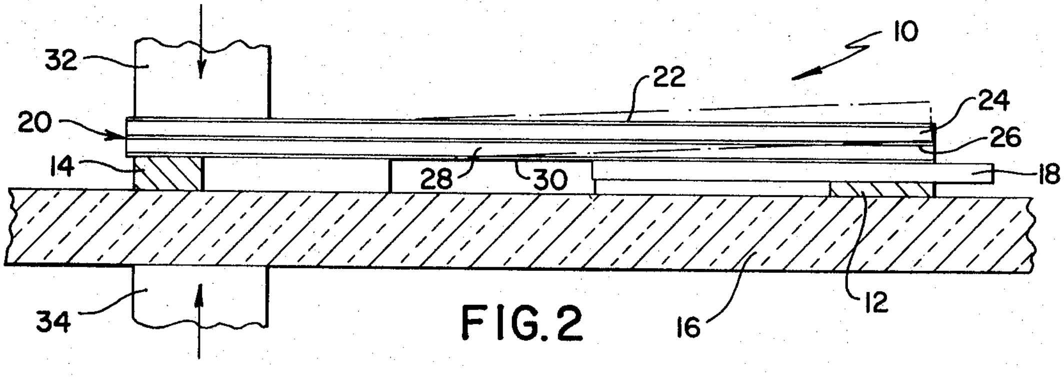
FIG. 2 is an elevation view of the capacitor of FIG. 1.

Reference is now made to FIGS. 1 and 2 of the drawings, which illustrate one exemplary embodiment of the piezoelectric-driven variable capacitor which is designated generally by the reference numeral 10. The capacitor is formed by mounting copper electrodes 12 and 14 on a dielectric substrate, such as ceramic, 16. The electrode 12 is of a lesser thickness than that of electrode 14. An insulating sheet 18 is supported on the top of electrode 12.

A piezoelectric flexure element, generally designated as 20 rests on electrode 14 and the insulating sheet 18. The piezoelectric flexure element 20 comprises electrode 22, a piezoelectric ceramic sheet or wafer 24, an intermediate electrode 26, a second piezoelectric ceramic sheet or wafer 28, and an electrode 30. Electrodes 22 and 30 are silver-plated on wafers 24 and 28. The ceramic wafer 24 will contract and the bottom ceramic wafer 28 will expand when a voltage, having the proper polarity, is applied between electrodes 22 and 30. Mechanically, this will result in the bending up of the piezoelectirc flexure element 20 when the one end thereof is held under mechanical pressure by any suitable means 32 and 34 as shown in FIG. 2. The pressure may be supplied by potting of the one end of capacitor 10. The dashed lines of FIG. 2 show the position of the piezoelectric flexure element 20 under the influence of an electric field.

With the piezoelectric flexure element 20 supported in the position shown in FIG. 2, it is seen that electrodes 12 and 30 form the plates of a capacitor. Electrode 30 also is in electrical continuity with electrode 14. Now, if a DC voltage is applied between electrodes 14 and 22, the piezoelectric flexure element 20 will bend up (if the voltage has the proper polarity) and the value of the capacitor formed by electrodes 12 and 30 will change.

Figures 3, 4:
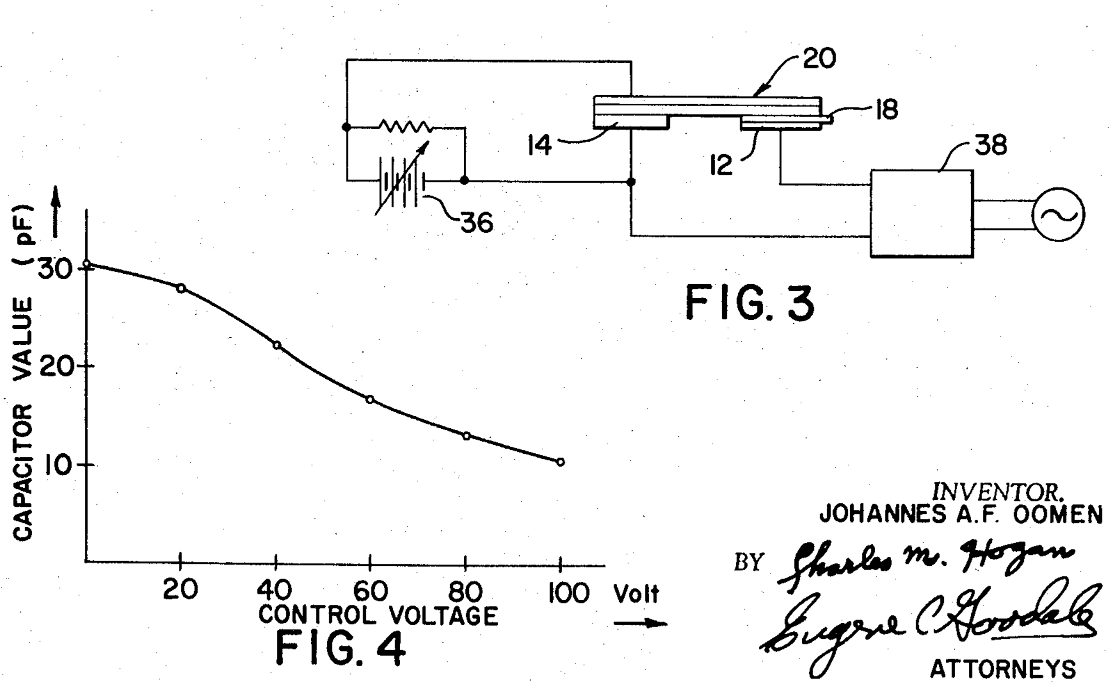
FIG. 3 is an electrical schematic of a test circuit used to obtain the capacity values of such a capacitor.
FIG. 4 is a graph of the relationship existing from the test setup of FIG. 3.

Using the piezoelectric driven variable capacitor shown in FIG. 2, a test circuit shown in FIG. 3 was used in determining the capacity values between capacitor electrodes 12 and 30. In this circuit, a variable voltage supply 36 is connected to electrode 22 of piezoelectric flexure element 20 and common electrode 14 in order to provide the necessary electric field. The resulting capacity values for each applied voltage was noted from any suitable means, such as capacitance bridge 38. The relationship between the applied voltage and the capacitor capacity value is shown in the graph of FIG. 4.

Figures 5, 6:
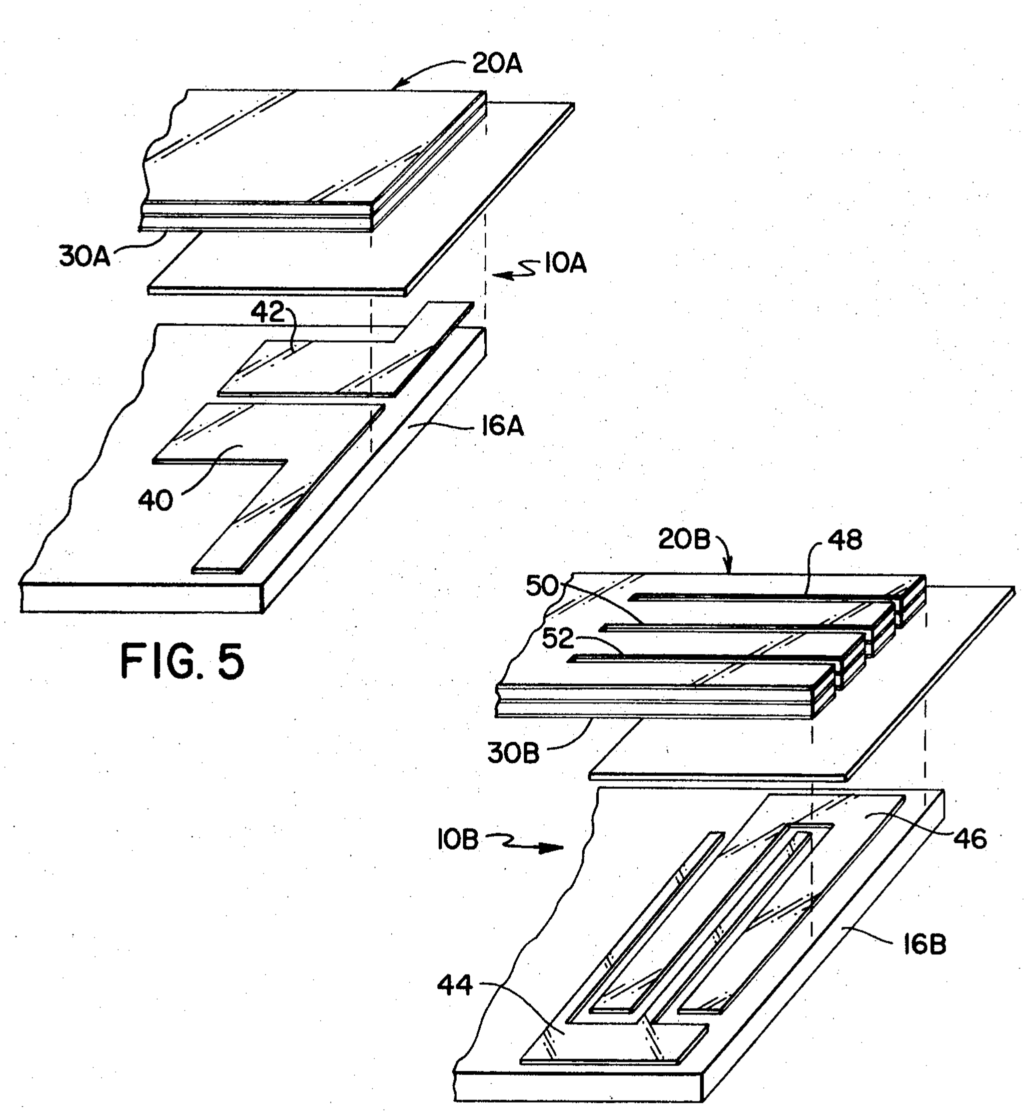
FIG. 5 is a fragmentary exploded perspective view showing another exemplary embodiment of this invention and particularly illustrating a multielectrode capacitor.
FIG. 6 is a fragmentary exploded perspective view showing another exemplary embodiment of this invention and particularly illustrating electrode construction for creep compensation.

Another exemplary embodiment of this invention is illustrated in FIG. 5 of the drawings. The variable capacitor illustrated in fragmentary form in FIG. 5 is very similar to the variable capacitor 10; therefore, such variable capacitor will be designated generally by the reference numeral 10A and parts of the variable capacitor 10A which are very similar to corresponding parts of the variable capacitor 10 will be designated by the same reference numeral as variable capacitor 10, also followed by the letter designation "A," and not described again. In this embodiment, electrode 30A of piezoelectric flexure element 20A forms one plate of the capacitor. Electrodes 40 and 42 are secured to substrate 16A and form the second plate of capacitor 10A. By dividing electrode 12 into electrically separate sections, i.e., 40 and 42, a set of "ganged" capacitors results having reasonable tracking between them.

Referring again to FIG. 4, it is seen that there is one capacitor value corresponding to each control voltage applied. However, because of inherent creep and expansion of the piezoelectric flexure element, the distance between the capacitor plates will vary causing a variance in capacitor value for a given control voltage. To compensate for this problem so as to provide a constant capacitor value, a "ganged" capacitor can be used in a servosystem. The value of one capacitor of the "gang" is continuously and automatically compared to the value of a fixed capacitor. In this way, variance due to temperature and creep may be automatically corrected.

Figure 7:
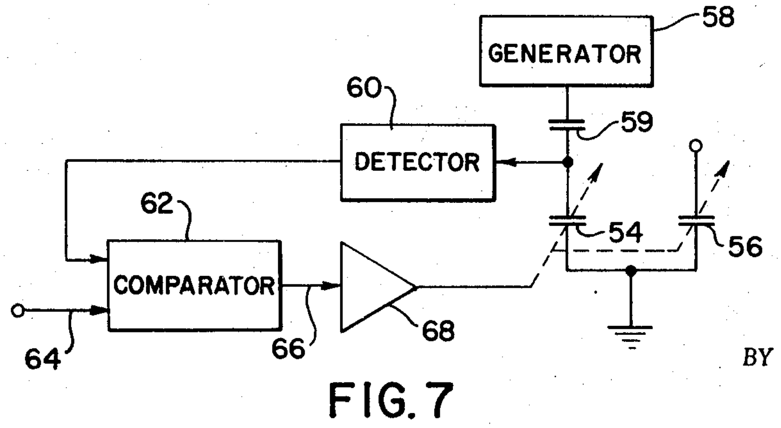
FIG. 7 is an electrical schematic of a voltage locked loop used to compensate for creep of the piezoelectric flexure element.

Referring to FIGS. 6 and 7, fragmentary view illustrating another embodiment of the variable capacitor 10 is shown and will be designated by the same reference numerals followed by the letter designation "B" and not described again. The capacitor 10B stationary electrode has been divided into two electrically separated electrodes 44 and 46. The electrodes 44 and 46 are mounted on substrate 16B. An insulating sheet 18B separates electrodes 44 and 46 from the piezoelectric flexure element 20B. It may be seen that the flexure element 20B is formed with a plurality of slots 48, 50 and 52 so that the flexure element comprises a plurality of fingerlike elements extending from a common source. Such a construction of the flexure element 20B helps decrease the problem due to creep.

The electrode 46 forms the main capacitor 56 (FIG. 7) together with the grounded electrode 30B of the moving flexure element 20B. The electrode 44 forms a pilot capacitor 54 (FIG. 7) together with the same grounded electrode 30B. There is a close one-to-one relationship between the pilot 54 an the main 56 capacitor because of the mechanical construction. This means that with any value of the pilot capacitor 54 only one value of the main capacitor 56 corresponds over all external possible conditions of creep due to temperature and vibration. Hence, by keeping the pilot capacitor 54 at a constant value, main capacitor 56 will also remain at a constant value.

Referring to FIG. 7, the capacitor value of the pilot capacitor 54 is measured by applying a high frequency signal from generator 58 via a relatively small capacitor 59. As a result, the magnitude of the generator signal across the pilot capacitor 54 is almost linearly proportional to its reactance. The value of the pilot capacitor 54 is measured by suitable means, such as an envelope detector 60 which removes the high frequency signal and produces a DC signal proportional to the value of the reactance of the pilot capacitor 54. The DC signal from detector 60 is used as one input to comparator 62. A reference signal 64 forms the other input of the comparator 62. The reference signal 64 and the DC signal are compared in comparator 62 and the resulting output signal 66 of the comparator 62 is transmitted to amplifier 68. The output signal from amplifier 68 is used to drive the piezoelectric flexure element 20B. As a result, the pilot capacitor 54 will maintain a value depending upon the value of the reference signal 64. Since the pilot capacitor 54 and the main capacitor 56 are closely related, the value of the main capacitor 56 will also depend upon the value of the reference voltage. Hence, by use of the voltage locked loop of FIG. 7, the voltage applied to the piezoelectric flexure element will be varied to compensate for creep of the flexure element and thus maintain a constant capacitor value for the main capacitor 56.

Because the RF-capacitor is completely separated from the piezoelectric flexure element, except for the one common electrode that it shared between them, the quality of the variable capacitor is almost entirely dependent upon the dielectric material. It is pointed out that this dielectric, as well as size and shape of electrodes, can be freely chosen so as to fulfill certain requirements. For instance, by choosing a material of much higher dielectric constant K, changes in capacity are feasible.

This invention provides a piezoelectric driven variable capacitor which accomplishes the objects aforementioned. A piezoelectric flexure element forms one plate of the capacitor and also is the driving element for varying the capacity value of the capacitor. Means are also provided to compensate for creep of the flexure element due to temperature, vibration, etc.

While present exemplary embodiments of this invention have been illustrated, it will be recognized that this invention may be otherwise variously embodied and practiced by those skilled in the art.

What is claimed is:

1. A variable capacitor comprising: a dielectric base; a fixed electrode fixedly mounted on said base, said electrode forming one plate of the capacitor; and a piezoelectric flexure element cantileverly mounted on said base in parallel spaced relation relative to said first electrode, the free end of said flexure element being positioned above said fixed electrode and bendable toward and away from said first electrode in response to an external electric field applied to said flexure element, said flexure element including a top electrode, a piezoelectric ceramic layer, an intermediate electrode, a second piezoelectric ceramic layer, and a bottom electrode, said bottom electrode forming the other plate of the capacitor, and wherein said bottom electrode will move toward and away from said fixed electrode in response to an electric field applied to said flexure element whereby the capacitance value between said bottom electrode and said fixed electrode varies relative to the distance therebetween.

2. A variable capacitor as set forth in claim 1 further comprising a second fixed electrode mounted on said base, said second electrode having a greater thickness than said first electrode, the fixed end of said piezoelectric flexure element being mounted on said second electrode wherein the bottom electrode is in contact with said second fixed electrode whereby the electric field to bend said flexure element is applied through said second fixed electrode and the top electrode.

3. A variable capacitor as set forth in claim 2 further comprising a dielectric member mounted on said first fixed electrode between said first fixed electrode and said piezoelectric flexure element.

4. A variable capacitor as set forth in claim 3 in which said first fixed electrode comprises a plurality of electrically separate sections wherein said plurality of electrically separate sections and common piezoelectric flexure element provide a set of ganged capacitors.

5. An assembly for providing a constant capacitor value in a piezoelectric variable capacitor which comprises in combination:

a dielectric base;

a first fixed electrode mounted on said base, said electrode forming one plate of a pilot capacitor;

a second fixed electrode mounted on said base, said second electrode forming one plate of a main capacitor, said first and second electrodes being complementally formed and mounted in close relationship one with the other;

a piezoelectric flexure element cantileverly mounted on said base in parallel spaced relation relative to said first and second stationary electrodes, the free end of said flexure element being positioned above said first and second electrodes and bendable toward and away from said electrodes in response to an external electric field applied to said flexure element, said flexure element forming the other plate of the pilot capacitor and the main capacitor;

means supplying an electric field to said piezoelectric flexure element wherein the free end will bend in response to said electric field whereby the capacitance value of the main capacitor varies relative to the distance between said piezoelectric flexure element and said second electrode;

means to detect the capacitance value of the pilot capacitor; and means providing a correction signal to said piezoelectric flexure element in response to the value of the pilot capacitor wherein the free end of said flexure element moves relative to said fixed electrodes whereby the capacitance value of the main capacitor is maintained at a constant value.

* * * * *